(12) United States Patent
Nakayama

(10) Patent No.: US 6,291,842 B1
(45) Date of Patent: Sep. 18, 2001

(54) FIELD EFFECT TRANSISTOR

(75) Inventor: Tatsuo Nakayama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/266,769

(22) Filed: Mar. 12, 1999

(30) Foreign Application Priority Data

Mar. 12, 1998 (JP) ................................................ 10-061142

(51) Int. Cl.$^7$ .................................................. H01L 31/0328
(52) U.S. Cl. ............................................................ 257/194
(58) Field of Search .............................................. 257/194

(56) References Cited

U.S. PATENT DOCUMENTS

| | | | |
|---|---|---|---|
| 4,894,691 | * | 1/1990 | Matsui .................................... 357/22 |
| 5,164,359 | * | 11/1992 | Calviello et al. ......................... 505/1 |
| 5,430,310 | * | 7/1995 | Shibasaki et al. .................... 257/190 |
| 5,756,375 | * | 5/1998 | Celii et al. .............................. 438/94 |
| 5,801,405 | | 9/1998 | Nakayama et al. ................... 257/192 |

FOREIGN PATENT DOCUMENTS

| | | |
|---|---|---|
| 61-210678 | 9/1986 | (JP) . |
| 2-5439 | 1/1990 | (JP) . |
| 4-3943 | 1/1992 | (JP) . |
| 4-333242 | 11/1992 | (JP) . |
| 5-175246 | 7/1993 | (JP) . |
| 9-175240 | 7/1993 | (JP) . |
| 05175246 A | * 7/1993 | (JP) . |
| 6-163601 | 6/1994 | (JP) . |
| 8-181304 | 7/1996 | (JP) . |

OTHER PUBLICATIONS

Akazaki et al., "Improved InAlAs/InGaAs HEMT Charactistics by Inserting an InAs Layer into the InGaAs channel", IEEE Elec. Dev. Lett. V13, pp325–327, Jun. 1992.*

Tatsushi AKAZAKI et al, "Improved InAlAs/InGaAs HEMT Characteristics by Inserting an InAs Layer into the InGaAs Channel", IEEE Electronic Device Letters, vol. 15, No. 6, Jun. 1992, pp. 325–327.

\* cited by examiner

Primary Examiner—Olik Chaudhuri
Assistant Examiner—Douglas A. Wille
(74) Attorney, Agent, or Firm—Foley & Lardner

(57) ABSTRACT

An FET (Field Effect Transistor) includes a substrate. Sequentially formed on the substrate area buffer layer (200 nm thick) formed of a first sphalerite type semiconductor implemented by $In_{0.52}Al_{0.48}$, a carrier running layer (6 nm thick) formed of a second sphalerite type semiconductor implemented by $In_{0.53}Ga_{0.47}As$, an InAs carrier running layer (7 nm thick), an AlAs spacer layer (2 nm thick), a spacer layer (2 nm thick) formed of a third sphalerite type semiconductor implemented by $In_{0.52}Al_{0.48}As$, a carrier supply layer (20 nm thick) formed of a fourth sphalerite type semiconductor implemented by $n^{-I}n_{0.52}Al_{0.48}As$ with $3\times10^{18}$ cm$^{-3}$ of Si added thereto, a Schottky layer (15 nm thick) formed of a fifth sphalerite type semiconductor implemented by $In_{0.52}Al_{0.48}As$, and a cap layer (20 nm thick) formed of a sixth sphalerite type semiconductor implemented by $n-In_{0.53}Ga_{0.47}As$ with $1\times10^{19}$ cm$^{-3}$ of Si added thereto. After the cap layer has been partly removed by recess etching, electrodes are formed. The InAs layer whose thickness is greater than a critical thickness constitutes an operating layer.

14 Claims, 2 Drawing Sheets

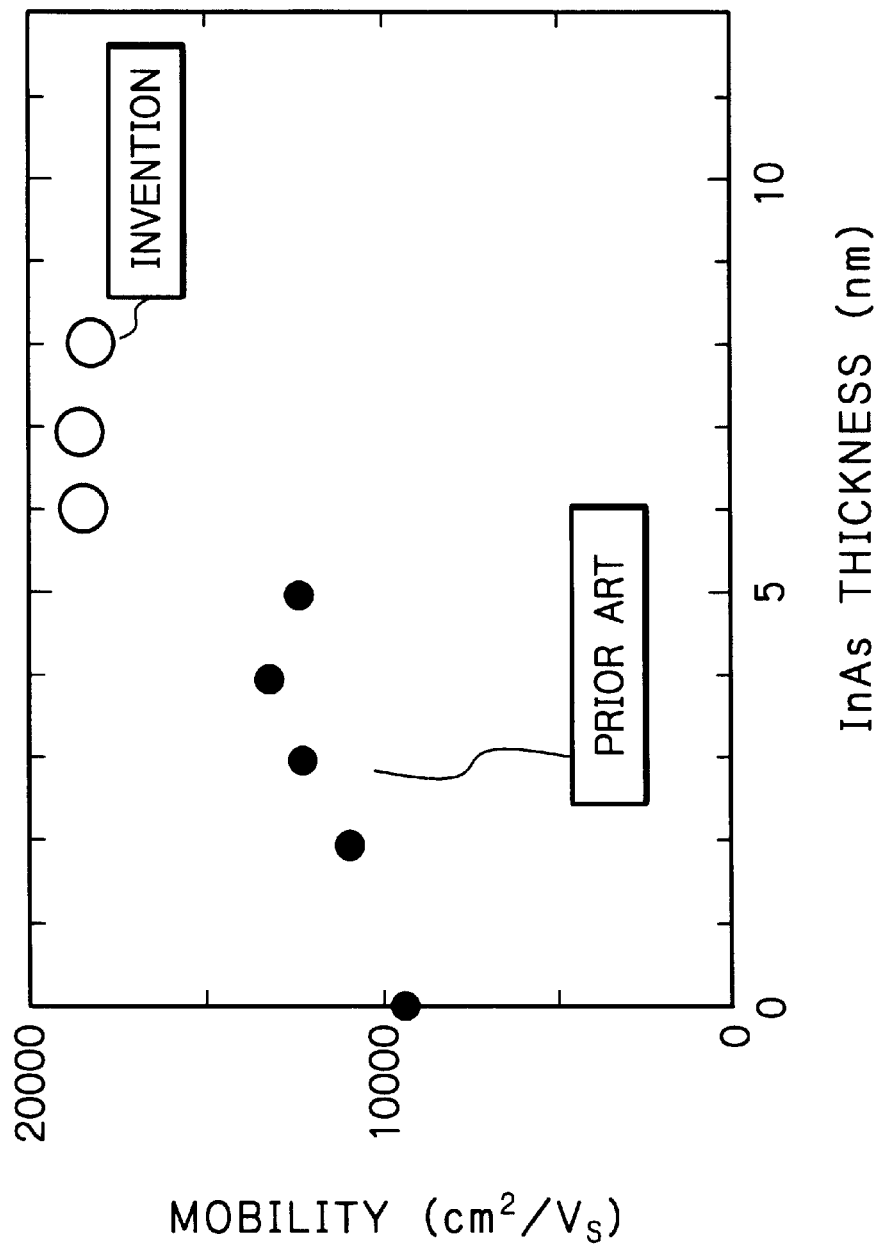

FIELD EFFECT TRANSISTOR

BACKGROUND OF THE INVENTION

The present invention relates to an FET (Field Effect Transistor) and more particularly to an FET having a high cutoff frequency.

To enhance the high frequency characteristic of an InAlAs/InGaAs FET formed on a substrate, it has been customary to provide an InGaAs layer or operating layer (carrier running layer) with a high InAs composition ratio. The effective InAs composition ratio of the operating layer may be increased by, e. g., inserting an InAs layer in an $In_{0.53}Ga_{0.47}As$ operating layer to form an $In_{0.53}Ga_{0.47}As/InAs/In_{0.53}Ga_{0.47}As$ structure, as proposed by Akasaki et al. in IEEE ELECTRON DEVICE LETTERS, VOL. 13, NO. 6, pp. 325, JUNE 1992.

The FET structure taught in the above document includes a substrate. Sequentially formed on the substrate are an InAlAs buffer layer, an InGaAs operating layer with an InAs layer inserted therein, an InAlAs spacer layer, an n-InAlAs carrier supply layer with Si added thereto, an InAlAs gate Schottky layer, an n-InAlAs cap layer with Si added thereto, and an n-In-GaAs cap layer with Si added thereto. The two cap layers and Schottky layer are partly removed by recess etching. Subsequently, a source and a drain electrode are formed on the n-InGaAs cap layer while a gate electrode is formed on the Schottky layer. The document describes that the above structure improves an electron transport characteristic, compared to a structure lacking the InAs layer in the InGaAs operating layer.

However, Akasaki et al. report that mobility decreases when the thickness of the InAs layer exceeds 4 nm. Because the InAs layer has a distortion of about 3.2% with respect to the substrate, a thickness insuring desirable crystal structure, i.e., a critical thickness is considered to be about 4 nm. As for the critical thickness, estimation based on, e.g., the theory of J. W. Matthews et al. disclosed in Journal of Crystal Growth, VOL. 27, pp. 118, 1974 also indicates that the critical thickness of InAs layer with respect to the substrate and InGaAs layer or the InAlAs layer lattice-matched to the substrate is about 4 nm. That is, the thickness of the InAs layer exceeding 4 nm deteriorates the crystal structure and electron transport characteristic. Therefore, with the conventional technologies, it is impossible to implement an InAs layer thicker than 4 nm as the operating layer of an FET. Moreover, when the InAs layer is thinner than 4 nm inclusive, electrons penetrate into the $In_{0.53}Ga_{0.47}As$ layer inferior in electron transport characteristic to the InAs layer adjoining it and run through both of the InAs layer and InGaAs layer. It is therefore impracticable to make the most of the desirable electron transport characteristic of the InAs layer or to enhance the characteristic of the FET to a sufficient degree.

Technologies relating to the present invention are also disclosed in Japanese Patent Laid-Open Publication Nos. 5-175246, 6-163601, 8-181304, and 9-172164.

SUMMARY OF THE INVENTION

It is therefore an object of the present invention to provide an FET capable of suppressing the penetration of carriers from an InAs operating layer to thereby enhance the confinement of the carriers in the operating layer, and obviating the deterioration of a crystal structure and that of the carrier transport characteristic ascribable thereto to thereby provide the InAs layer with an unprecedented carrier transport characteristic.

In accordance with the present invention, in a hetero junction FET formed on a high resistance substrate and including an InAs layer in a carrier running layer, the InAs layer is thicker than 4 nm, and a layer of AlAs or GaAs or a mixture thereof is formed on and contacts the InAs layer.

BRIEF DESCRIPTION OF THE DRAWINGS

The above and other objects, features and advantages of the present invention will become more apparent from the following detailed description taken with the accompanying drawings in which:

FIG. 2 is a graph showing an advantage achievable with the present invention.

DESCRIPTION OF THE PREFERRED EMBODIMENT

Figure 1:
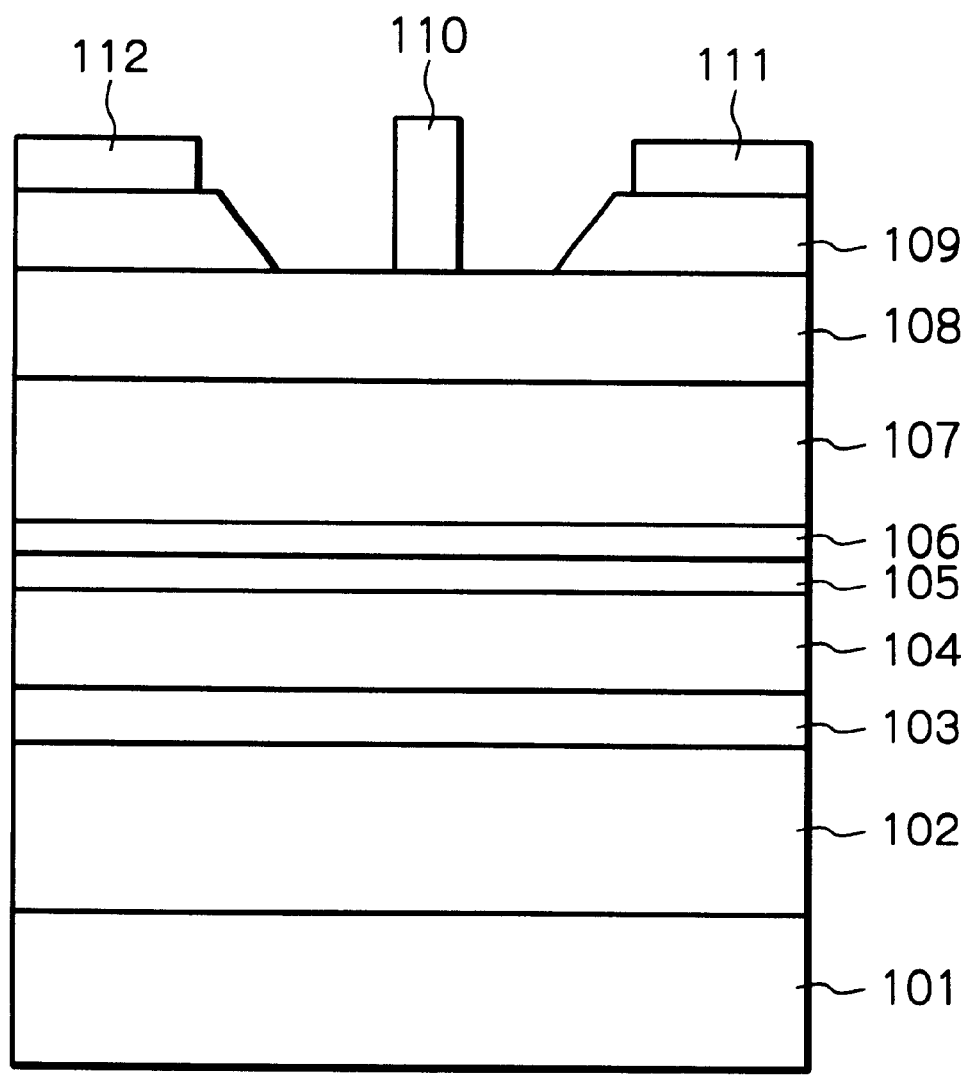
FIG. 1 is a section showing an FET embodying the present invention.

To begin with, an FET of the present invention will be briefly described. The FET of the present invention is a hetero junction FET formed on a high resistance substrate and including an InAs layer in its carrier running layer. The FET is characterized in that the InAs layer is thicker than 4 nm, in that a semiconductor layer of AlAs or GaAs or a mixture thereof is formed on and contacts the InAs layer.

When the InAs layer is thinner than 4 nm inclusive, carriers gather in the vicinity of a hetero interface (carrier supply layer), and mobility decreases due to the influence of Coulomb scattering. The InAs layer should therefore be thicker than 4 nm. In addition, the InAs layer which is thicker than 4 nm reduces the penetration of the carriers therefrom, i.e., sufficiently confines the carriers therein, insuring high mobility. Further, the layer of AlAs or GaAs or a mixture thereof contacting the InAs layer is successful to form a flat hetero interface and therefore to make the most of the carrier transport ability available with InAs.

Also, the hetero junction FET of the present invention formed on a high resistance substrate and including the InAs layer in the carrier running layer is characterized in that the InAs layer is thicker than 4 nm, but thinner than 10 nm inclusive, and in that the layer of AlAs or GaAs or a mixture thereof is formed on and contacts the InAs layer.

Further, the hetero junction FET of the present invention formed on a high resistance substrate and including the InAs layer in the carrier running layer is characterized in that the InAs layer is thicker than 4 nm, and in that the layer of AlAs or GaAs or a mixture thereof is formed on and contacts the InAs layer. The layer of AlAs or GaAs or a mixture thereof may be thinner than the critical thickness (4 nm) inclusive, preferably 1 nm to 4 nm.

The operation of the FET of the present invention is as follows. Because the InAs layer has low surface free energy, it becomes three-dimensional, i.e., undulates during low speed growth or in the event of interruption of growth if thicker than a certain thickness. Further, assume that an InGaAs layer, for example, lattice-matched to the substrate is formed on the InAs layer at the time of formation of a hetero interface. Then, In atoms or Ga atoms can easily move on the surface of the InAs layer because the surface free energy of InAs is lower than that of InGaAs and because the connection of InGaAs is weak. Therefore, if an InGaAs layer or an InAlAs layer is formed on the InAs layer, then the InGaAs layer becomes three-dimensional in a short period of time and causes the underlying InAs layer to appear. The undulation on the hetero interface deteriorates the crystal structure. Moreover, the undulation of the hetero interface itself obstructs the movement of the carriers and thereby deteriorates the electron transport characteristic of the FET. The formation of undulation is accelerated by an increase in strain energy, i.e., an increase in the thickness of the InAs layer. Although the thickness of the InAs layer above 4 nm causes undulation to occur even during growth, it is possible to render the hetero interface flat by causing the InAs layer to grow at a higher rate than the formation of the undulation. However, because the InAs layer is extremely unstable, undulation is formed as soon as the growth ends.

In accordance with the present invention, the InAs operating layer and AlAs layer contact each other. At a temperature for the growth of the InAs layer, AlAs is extremely stable and obstructs the movement of Al atoms on its surface. It follows that even if the InAs layer is thicker than 4 nm, covering the surface of the InAs layer before the formation of the undulation is successful to obviate the three-dimensional configuration and undulation, transposition and other deterioration of the crystal structure at the hetero interface ascribable thereto. This is also true when GaAs or AlGaAs is used. In this manner, the FET of the present invention can use the InAs layer thicker than 4 nm as an operating layer while preserving a desirable crystal structure, obstructs the penetration of electrons from the InAs operating layer, makes the most of the desirable electron transport characteristic particular to InAs, and thereby achieves noticeably improved characteristics.

Referring to FIG. 1 of the drawings, an FET embodying the present invention is shown and includes a substrate 101 having high resistance. Sequentially formed on the substrate 101 are a buffer layer 102 formed of a first sphalerite type semiconductor, a carrier running layer 103 formed of a second sphalerite type semiconductor, a carrier running layer 104 formed of InAs, a spacer layer 105 formed of AlAs, a spacer layer 106 formed of a third sphalerite type semiconductor, a carrier supply layer 107 formed of a fourth sphalerite type semiconductor with an impurity added thereto, a Schottky layer 108 formed of a fifth sphalerite type semiconductor, and a cap layer 109 formed of a sixth sphalerite type semiconductor. The cap layer 109 is partly etched, and then a Schottky gate electrode 110 making Schottky contact with the Schottky layer 108 is formed. Subsequently, a source electrode 111 and a drain electrode 112 are formed by using a material capable of making Ohmic contact with the cap layer 109.

To form the above laminate, use is made of a molecular beam epitaxial growth system. The buffer layer 102 is 200 nm thick and formed of $In_{0.52}Al_{0.48}As$ which is the first sphalerite type semiconductor. The carrier running layer 103 is 6 nm thick and formed of $In_{0.53}Ga_{0.47}As$ which is the second sphalerite type semiconductor. The InAs carrier running layer 104 is 7 nm thick while the AlAs spacer layer 105 is 2 nm thick. The spacer layer 106 is 2 nm thick and formed of $In_{0.52}Al_{0.48}As$ which is the third sphalerite type semiconductor. The carrier supply layer 107 is 20 nm thick and formed of n-$In_{0.52}Al_{0.48}As$, which is the fourth sphalerite type semiconductor, with $3\times10^{18}$ $cm^{-3}$ of Si added thereto. The Schottky layer 108 is 15 nm thick and formed of $In_{0.52}Al_{0.48}As$ which is the fifth sphalerite type semiconductor. The cap layer is 20 nm thick and formed of n-$In_{0.53}Ga_{0.47}As$, which is the sixth sphalerite type semiconductor, with $1\times10^{9}$ $cm^{-3}$ of Si added thereto.

After the cap layer 109 has been partly removed by recess etching, the source electrode 111 and drain electrode 112 are formed on the cap layer 109 in the form of an Au/Pt/Ti/Mo metal laminate. The gate electrode implemented as an Au/Pt/Ti/Mo metal laminate is formed on the Schottky layer 108.

The above structure reduces the migration distance on the surface of the AlAs layer. This, coupled with the strong connection of AlAs, suppresses the formation of undulation and renders the InAs/AlAs hetero interface flat while reducing the deterioration of the crystal structure. That is, the illustrative embodiment allows InAs layer to be as thick as 7 nm while maintaining a desirable crystal structure and causes a minimum of electrons to penetrate out of the InAs carrier running layer. Specifically, the illustrative embodiment confines more than 85% of electrons in the carrier running layer having a desirable electron transport characteristic. It was experimentally found that the above structure realized mobility as high as 18,500 $cm^2/Vs$ and a sheet carrier concentration of $3.16\times10^{12}$ $cm^{-2}$ at room temperature.

While the Schottky gate electrode 110 is implemented by an Au/Pt/Ti/Mo metal laminate, it may be formed of any other suitable material capable of making Schottky contact with a semiconductor to contact, e.g., $In_{0.52}Al_{0.48}As$ in the illustrative embodiment. Likewise, the source electrode 111 and drain electrode 112 may each be implemented by any suitable material other than an Au/Pt/Ti/Mo metal laminate so long as it can make Ohmic contact with a semiconductor to contact, e.g., n-$In_{0.53}Ga_{0.47}As$ in the illustrative embodiment.

In the illustrative embodiment, the first, third and fifth sphalerite type semiconductors are implemented by $In_{0.52}Al_{0.48}As$. The crux is that the first, third and fifth sphalerite type semiconductors each be implemented by a mixed crystal compound semiconductor constituted by two or more of compound semiconductors, i.e., n- or p-type GaAs, AlAs, InAs, GaP, AlP, GaN, AlN, InN, GaSb and AlSb each having an impurity concentration lower than $10^{16}$ $cm^{-3}$ inclusive. However, it is necessary that each layer has a composition ratio not causing transposition to occur at a desired thickness. For example, when the first sphalerite type semiconductor is 200 nm thick, as in the illustrative embodiment, a composition ratio reducing lattice mismatching to less than about ±0.15% with respect to the substrate is required. Therefore, for the InAlAs layer used in the illustrative embodiment, the InAs composition ratio must be about 0.52±0.02.

For a particular purpose of the device, the first, third and fifth sphalerite type semiconductors may each include a mixed crystal semiconductor layer implemented by a binary compound semiconductor, i.e., n- or p-type GaAs, AlAs, InAs, GaP, AlP, GaN, AlN, InN, GaSb or AlSb having an impurity concentration lower than $10_{16}$ cm$_{-3}$ inclusive or a mixture of two or more of them, and different from the first, third or fifth sphalerite type semiconductor. However, it is necessary that each layer inserted be provided with a thickness not causing transposition to occur. For example, when AlAs is inserted in the first sphalerite type semiconductor, it should be less than 4 nm thick inclusive because of lattice mismatching of about 3.2%. Further, the third and fifth sphalerite type semiconductors may not be present independently of the other layers, depending on the purpose of the device.

In the illustrative embodiment, the second sphalerite type semiconductor is implemented by $In_{0.53}Al_{0.47}As$. The crux is that the second sphalerite type semiconductor be implemented by a mixed crystal compound semiconductor implemented by a binary compound semiconductor, e.g., high purity or n- or p-type GaAs, AlAs, InAs, GaP, AlP, GaN, AlN, InN, GaSb, AlSb or InSb or a mixture of two or more of them. However, it is necessary that the second sphalerite type semiconductor layer has greater electron affinity than the first and third sphalerite type semiconductor layers. In addition, the second sphalerite type semiconductor should have a composition ratio and a thickness not causing transposition to occur.

In the illustrative embodiment, the fourth sphalerite type semiconductor is implemented by $n-In_{0.52}Al_{0.48}As$. The crux is that the fourth sphalerite type semiconductor be implemented by a mixed crystal compound semiconductor implemented by a binary compound semiconductor, i.e., n- or p-type GaAs, AlAs, InAs, GaP, AlP, GaN, AlN or InN with an impurity added thereto or a mixture of two or more of them. However, it is necessary that the fourth sphalerite type semiconductor a composition ratio not causing transposition to occur at a desired thickness. For example, when the fourth sphalerite type semiconductor is 20 nm thick, as in the illustrative embodiment, a composition ratio reducing lattice mismatching to less than about ±1% with respect to the substrate is required. Therefore, for the InAlAs layer used in the illustrative embodiment, the InAs composition ratio must be 0.52±0.15.

In the illustrative embodiment, the sixth sphalerite type semiconductor is implemented by $n-In_{0.53}Ga_{0.47}As$. The crux is that the sixth sphalerite type semiconductor be implemented by a mixed crystal compound semiconductor implemented by a binary compound semiconductor, i.e., n- or p-type GaAs, AlAs, InAs, GaP, AlP, GaN, AlN, InN, GaSb or AlSb with an impurity added thereto or a mixture of two or more of them. However, it is necessary that the sixth sphalerite type semiconductor has a composition ratio not causing transposition to occur at a desired thickness. For example, when the sixth sphalerite type semiconductor is 20 nm thick, as in the illustrative embodiment, a composition ratio reducing lattice mismatching to less than about ±1% with respect to the substrate is required. Therefore, for the InGaAs layer used in the illustrative embodiment, the InAs composition ratio must be about 0.52±0.15.

As for the fourth and sixth sphalerite type semiconductors, an n-type dopant or impurity is implemented by Si because electrons are used as carriers. If desired, any other suitable n-type dopant, e.g., S or Se may be used. Further, as for an FET using holes as carriers, use may be made of Be, Mg, C or similar p-type dopant.

FIG. 2 compares the present invention and the conventional technology taught in the previously mentioned document with respect to a relation between the thickness of the InAs layer in the carrier running layer and the mobility. In FIG. 2, dots and circles respectively indicate the result of the present invention and the result of the conventional technology. As shown, in accordance with the conventional technology, the highest mobility is achieved when the InAs layer in the carrier running layer is 4 nm, and the mobility decreases with an increase in the thickness of the InAs layer when the thickness exceeds 4 nm. By contrast, in accordance with the present invention, the mobility further increases with an increase in the thickness of the InAs layer even when the thickness exceeds 4 nm. This is because the AlAs layer, GaAs layer or AlGaAs layer, i.e., a mixture of AlAs and GaAs, that is contacting the top of the InAs layer renders the hetero interface between the InAs operating layer and any up the AlAs layer or between the the InAs layer and the GaAs layer and, or between the InAs layer the AlGaAs layer flat and prevents the crystal structure from being deteriorated. The present invention therefore achieves an FET having a higher mobility and a higher cutoff frequency than conventional FETs.

Various modifications will become possible for those skilled in the art after receiving the teachings of the present disclosure without departing from the scope thereof.

What is claimed is:

1. A hetero junction Field Effect Transistor comprising:

a high resistance substrate, a channel layer formed above said substrate, an InAs layer formed as a top layer of said channel layer, wherein said InAs layer is thicker than 4 nm, and a layer of AlAs or GaAs or a mixture thereof is formed on and contacts said InAs layer and has a thickness between 1 nm and 4 nm inclusive.

2. An FET as claimed in claim 1, wherein said InAs layer is less than 10 nm thick inclusive.

3. A hetero junction field effect transistor comprising:

a high resistance substrate, a buffer layer formed over said substrate, a channel layer formed over said buffer layer, wherein said channel layer is comprised of a sphalerite material, an InAs layer that is formed over said channel layer, wherein said InAs layer has a thickness greater than 4 nm, and a contact layer formed over said InAs layer, wherein said contact layer comprises at least one of AlAs and GaAs having a thickness between 1 nm and 4 nm inclusive.

4. An FET as recited in claim 1, wherein the substrate comprises an InP substrate.

5. An FET as recited in claim 4, further comprising a buffer layer formed on the InP substrate and having the same lattice constant as the InP substrate.

6. An FET as recited in claim 3, wherein the substrate comprises an InP substrate.

7. An FET as recited in claim 6, further comprising the step of:

a buffer layer formed on the InP substrate and having the same lattice constant as the InP substrate.

8. An FET as claimed in claim 3, wherein said InAs layer is less than 10 nm thick, inclusive.

9. An FET as claimed in claim 3, wherein said contact layer comprising at least one of AlAs and GaAs is thicker than 1 nm, and thinner than 4 nm, inclusive.

10. A hetero junction field effect transistor comprising:

a high resistance substrate, a buffer layer of a first sphalerite material formed over said substrate, a channel layer having a first sub-layer formed of a second sphalerite material and disposed over said buffer layer and a second sub-layer, disposed over the first sub-layer and formed of InAs having a thickness greater than 4 nm, a first spacer layer disposed over said channel layer, a second spacer layer of a third sphalerite material and disposed over said first spacer layer, a carrier supply layer formed of a fourth sphalerite material and disposed over said second spacer layer, and a schottky layer formed of a fifth sphalerite material and disposed over said carrier supply layer.

11. A hetero junction field effect transistor as recited in claim 10 wherein said carrier supply layer is formed of n-$In_{0.52}Al_{0.48}As$.

12. A hetero junction field effect transistor as recited in claim 11 wherein said carrier supply layer is doped with Si.

13. A hetero junction field effect transistor as recited in claim 12 wherein the concentration of Si is $3\times10^{18}$ cm$^{-3}$.

14. A hetero junction field effect transistor as recited in claim 10 wherein said carrier supply layer comprises a mixed crystal compound semiconductor implemented by a compound semiconductor with an impurity added thereto.

* * * * *